April 6, 1965 J. K. PULFER ETAL 3,177,378
TRANSISTOR AMPLIFIER AND FREQUENCY MULTIPLIER
Filed Oct. 2, 1962
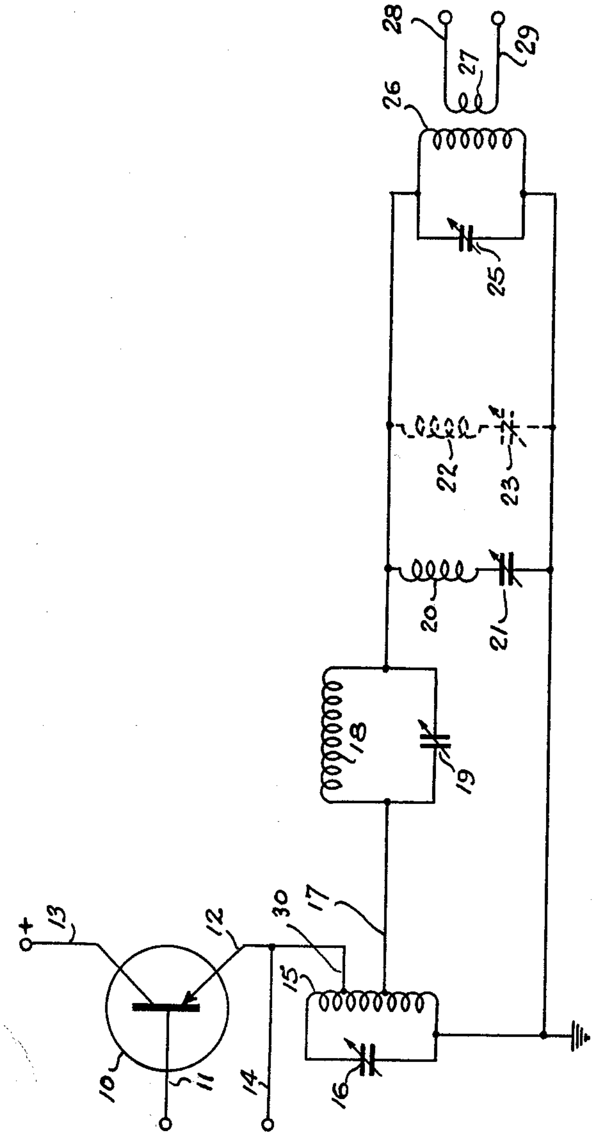
INVENTORS
JAMES K. PULFER
ALBERT E. LINDAY
BY James R. Hughes
PATENT AGENT United States Patent Office 3,177,378
Patented Apr. 6, 1965

3,177,378

TRANSISTOR AMPLIFIER AND FREQUENCY MULTIPLIER

James Kenneth Pulfer and Albert Edward Lindsay, Ottawa, Ontario, Canada, assignors to National Research Council, Ottawa, Ontario, Canada, a body corporate of Canada Filed Oct. 2, 1962, Ser. No. 227,947
2 Claims. (Cl. 307—88.5)

This invention relates to a frequency multiplier and more particularly to frequency multiplication in a transistor amplifier.

It is well known to obtain frequency multiplication by using a non-linear device giving an output having strong harmonic content. The output of the device is connected to a resonant circuit tuned to the frequency of the harmonic that is desired to be obtained. Another well known device is the variable capacitance junction diode or varactor in which the capacitance across the junction may be varied at extremely rapid rates by changing the votage across the junction. This capability has given rise to the use of the variable capacitance diode frequency multipliers, parametric amplifiers, etc.

Although the use of the transistor as a power amplifier has now become quite widespread, it has been limited by the reduced performance (gain) at the higher frequencies. Much time and effort has been given to the development of transistors that will operate satisfactorily at very high frequencies.

It is an object of the present invention to provide a transistor amplifier or oscillator that will also give an output at a frequency that is an increased multiple of the input.

Another object of the invention is to provide a circuit in which a transistor will generate or amplify power at a frequency well within its normal capability and at the same time deliver a useful portion of this power to an output at a frequency which is normally beyond its capability.

These and other objects of the invention are achieved by providing a circuit in which a transistor amplifies an input signal having a frequency within the normal range of operation of the transistor and a junction of the transistor acting as a variable capacitance diode provides an output signal at a much higher frequency and at a useful power level. A resonant circuit tuned to the frequency of the input is connected to the output of the transistor to provide the proper impedance for the operation of voltages and currents at the input frequency across the junctions of the transistor. A second resonant circuit tuned to the desired output frequency is also connected to the output of the transistor to provide an output to the circuit at a frequency harmonically related to the input frequency. One or more additional resonant circuits are used to prevent the fundamental frequency and undesired harmonic frequencies from reaching the output.

In a drawing which illustrates an embodiment of the invention,

FIGURE 1 is a diagram of a transistor operating in a circuit according to the invention.

Referring to the drawing, a transistor 10 has a base 11, emitter 12, and collector 13. The input is applied between base 11 and emitter 12 with emitter 12 also connected to ground through a first resonant circuit made up of a capacitor 16 and an inductor 15 in parallel. Capacitor 16 is variable for tuning purposes and the connection from emitter 12 to the resonant circuit is by means of a variable tap 30 on inductor 15. This circuit is tuned to the frequency of the input frequency and is necessary to provide the necessary impedance for the transistor acting as an amplifier. A second tap 17 is connected to inductor 15 and leads to an output parallel resonant circuit made up of a capacitor 25 and inductor 26 through a trap parallel resonant circuit made up of inductor 18 and capacitor 19. The output resonant circuit is tuned to the desired frequency which is harmonically related to the input frequency. The trap circuit is tuned to the input or fundamental frequency to prevent this frequency from reaching the output. The output of the circuit is taken at 28 and 29 from inductor 27 which is coupled to inductor 26 of the output resonant circuit. One or more idling circuits shown here as series resonant circuits made up of inductors 20 and 22 and capacitors 21 and 23 are connected from the output line to ground. These circuits are tuned to other frequencies harmonically related to the input frequency and are used to prevent these undesired frequencies from reaching the output.

Collector 13 of transistor 10 is connected to a D.C. power supply which should have an impedance which is essentially zero at the radio frequencies used in the circuit.

In operation an input signal is applied to the circuit and is amplified by the transistor. It has been found that the junctions of certain transistors will act as variable capacitance diodes and this characteristic of the transistor has been used to provide frequency multiplication in a transistor simultaneous with amplification. The taps on inductor 15 are adjusted to provide a low impedance path for the desired harmonic voltage between emitter 12 and tap 17, a high impedance path between tap 17 and ground, and at the same time optimize amplification of the signal at the input or fundamental frequency.

In the above description an amplifier circuit has been described. If the necessary feedback loop is provided an oscillator circuit can be obtained. In addition, different circuit configurations lying within the scope of the invention would suggest themselves to those skilled in this field. Transistors of the n-p-n or p-n-p type can be used and transistor configurations other than the grounded emitter shown would operate.

Not all transistors are suitable for incorporation in this type of circuit. The necessary requirement for the type of transistor used is that it is capable of operation as an amplifier at the input frequency with the desired efficiency and that one or more of the transistor junctions is capable of operating as a variable capacitance harmonic generator with the desired efficiency. Typical commercial transistors that may be used are type 2N1505, 2N1506, 2N1709, and PT–530A. There are probably many others that could be used.

What is claimed is:

1. A transistor amplifier and frequency multiplier comprising, (*a*) a junction transistor having a base, a collector, and an emitter, and in which the base-to-collector junction acts as a variable capacitance harmonic generator, (*b*) means for supplying a signal at a frequency lying within the normal range of operation of the transistor between the base and emitter of said transistor, (*c*) a first resonant circuit tuned to the frequency of the input signal, (*d*) a source of direct current bias voltage, (*e*) means for connecting said first resonant circuit and said bias voltage in series between collector and emitter of said transistor, (*f*) a second resonant circuit tuned to a desired harmonic of said signal frequency connected across at least a portion of said first resonant circuit, (g) said desired harmonic frequency being above the normal range of operation of the transistor, (h) output means coupled to said second resonant circuit to extract a signal at the desired harmonic therefrom, (i) a third resonant circuit tuned to the input signal frequency connected in the line between the first resonant circuit and the second resonant circuit to prevent the said signal frequency from reaching the second resonant circuit, and (j) at least one resonant circuit connected in parallel with the second resonant circuit and tuned to the frequency of an undesired harmonic of the input signal frequency to prevent said undesired frequency from reaching the second resonant circuit.

2. A method of operating a transistor simultaneously as an amplifier and a frequency multiplier comprising, (a) feeding the transistor with a signal at a frequency within the normal range of operation of the transistor, (b) connecting the transistor to a source of direct current bias voltage, (c) providing impedance means at the output of the transistor such that the transistor will amplify the input signal, (d) taking an output at a frequency and power level much above the normal range of operation of the transistor from the transistor output junction acting as a variable capacitance harmonic generator by means of a resonant circuit tuned to a desired harmonic of the frequency of the input signal, and (e) inserting tuned circuit means in the output of the transistor to prevent the input signal frequency and undesired harmonics of this frequency from reaching the output tuned circuit.

References Cited by the Examiner

UNITED STATES PATENTS

| | | | |
|---|---|---|---|
| 2,013,806 | 9/35 | Osnos | 328—16 |
| 2,915,708 | 12/59 | Mohler | 331—76 |
| 2,982,928 | 5/61 | Kall | 333—76 |
| 3,060,364 | 10/62 | Holcomb | 321—69 |
| 3,085,205 | 4/63 | Sante | 328—16 |

FOREIGN PATENTS 401,316 11/33 Great Britain.

OTHER REFERENCES

Pub. I "Parametric Amplification by Charge Storage" in Proceedings of the IRE, dated May 1961, page 967.

ARTHUR GAUSS, *Primary Examiner.*